(12) United States Patent
Enders et al.

(10) Patent No.: US 7,045,422 B2
(45) Date of Patent: May 16, 2006

(54) SEMICONDUCTOR GATE STRUCTURE AND METHOD FOR FABRICATING A SEMICONDUCTOR GATE STRUCTURE

(75) Inventors: Gerhard Enders, Olching (DE); Helmut Schneider, München (DE); Peter Voigt, Hallbergmoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/854,772

(22) Filed: May 27, 2004

(65) Prior Publication Data
US 2004/0262697 A1   Dec. 30, 2004

(30) Foreign Application Priority Data
May 28, 2003   (DE) ................ 103 24 448

(51) Int. Cl.
*H01L 29/72* (2006.01)
(52) U.S. Cl. ................ 438/257; 438/259; 257/388
(58) Field of Classification Search ........ 257/388, 257/347; 438/259, 291, 257
See application file for complete search history.

(56) References Cited

U.S. PATENT DOCUMENTS

| 5,434,093 A | 7/1995 | Chau et al. | |
|---|---|---|---|
| 6,107,140 A * | 8/2000 | Lee et al. .............. | 438/259 |
| 2002/0028555 A1 | 3/2002 | Boyd et al. | |
| 2003/0162358 A1* | 8/2003 | Hanafi et al. ........... | 438/291 |
| 2004/0104433 A1* | 6/2004 | Ieong et al. ........... | 257/347 |

* cited by examiner

*Primary Examiner*—Edward Wojciechowicz
(74) *Attorney, Agent, or Firm*—Morrison & Foerster LLP

(57) ABSTRACT

A method for fabricating a semiconductor gate structure including depositing at least one sacrificial layer on a semiconductor substrate; patterning the at least one sacrificial layer to form at least one cutout in the at least one sacrificial layer for uncovering the semiconductor substrate; forming a sidewall spacer over the sidewalls of the at least one sacrificial layer in the at least one cutout; forming a gate dielectric on the semiconductor substrate in the cutout; providing a gate electrode in the at least one cutout in the at lest one sacrificial layer; and removing the at least one sacrificial layer for the uncovering the gate electrode surrounded by the sidewall spacer. A semiconductor device is also provided.

8 Claims, 3 Drawing Sheets

SEMICONDUCTOR GATE STRUCTURE AND METHOD FOR FABRICATING A SEMICONDUCTOR GATE STRUCTURE

CLAIM FOR PRIORITY

This application claims priority to German Application No. 103 24 448.4 filed May 28, 2003, which is incorporated herein, in its entirety, by reference.

TECHNICAL FIELD OF THE INVENTION

The invention relates to a semiconductor gate structure, to a method for fabricating a semiconductor gate structure, and in particular to a MOS gate structure and to a method for fabricating such a MOS gate structure.

BACKGROUND OF THE INVENTION

At the present time, MOS circuits of field-effect transistors generally comprise polysilicon gates or gate structures which are constructed from a plurality of layers arranged one above the other, such as, for example, polysilicon/tungsten silicide or polysilicon/tungsten nitride/tungsten. However, such gates with a polysilicon layer at the interface with the gate oxide have quite a number of disadvantages, e.g., a high gate bulk resistance, dopant depletion in the polysilicon at the interface with the gate oxide, an increased dopant concentration permeating through the gate oxide in the channel, and an unfavorable value with regard to the work function. In order to simultaneously achieve a high performance both for the n-channel transistor and for the p-channel transistor, it is necessary to dope the polysilicon differently for the n-channel and p-channel transistors (dual work function).

If, in contrast to this, avoiding the above disadvantages, a metal is used as gate electrode, the problem arises that it is not possible to effect a patterning of the then metallic gate electrode selectively with respect to the gate oxide and a reoxidation of the gate, i.e., an encapsulation of the gate, with a thermal oxide, as in the case of an above processing of a polysilicon gate. Further, during the etching of metals the selectivity with respect to the oxide is significantly poorer than in the case of a poly gate, i.e., after a patterning of a metal layer, it is not possible to stop the etching operation within the underlying oxide layer, rather an incipient etching of the substrate in the overetching phase is unavoidable. This can lead to failure of the component.

Moreover, customary polysilicon gates and gates with a plurality of layers have high gate thicknesses in order to keep the sheet resistance sufficiently low. In the context of advancing miniaturization of the feature sizes, however, it is necessary also to reduce the gate stack height in order to be able to provide sufficiently large process windows for further process steps, such as an inclined implantation, for example. What is additionally problematic is the fabrication of gates with different work functions (dual work function gates) in circuits with a high performance requirement, which entails a high process complexity.

SUMMARY OF THE INVENTION

It is an object of the invention to provide a semiconductor gate structure and a method for fabricating a semiconductor gate structure, whereby at least one of the abovementioned disadvantages is eliminated.

According to an aspect of the invention, this object is achieved by a method for fabricating a semiconductor gate structure by depositing at least one sacrificial layer on a semiconductor substrate; patterning the at least one sacrificial layer to form at least one cutout in the at least one sacrificial layer to uncover the semiconductor substrate; forming a sidewall spacer over the sidewalls of the at least one sacrificial layer in the at least one cutout; forming a gate dielectric on the semiconductor substrate in the cutout; providing a gate electrode in the at least one cutout in the at least one sacrificial layer; and removing the at least one sacrificial layer to uncover the gate electrode surrounded by the sidewall spacer.

Further according to this aspect of the invention, the method is achieved by a semiconductor device having a semiconductor substrate; a gate dielectric on the semiconductor substrate to provide a gate insulation; a gate electrode made of metal arranged above the gate dielectric for gate driving; and an at least single-layered gate sidewall spacer for lateral encapsulation of the gate electrode, the gate electrode tapering in the direction of the gate dielectric.

The idea on which the invention is based essentially includes producing a negative sacrificial gate structure in which gate regions are etched free, subsequently producing a gate oxide and a sidewall oxide, and thereupon filling the patterned trenches with a gate electrode, for example, made of metal, and then removing the negative sacrificial gate structure.

The use of a negative sacrificial gate structure according to the invention and of the above-mentioned production of a sidewall oxide prevents a dopant accumulation in the gate region, which results in an improved short-channel behavior relative to gate electrodes which are fabricated in a known manner.

In accordance with one aspect of the invention, a plurality of sacrificial layers are deposited on the semiconductor substrate, the plurality at least comprising a sacrificial oxide layer, a polysilicon layer and a silicon nitride layer.

In accordance with a further aspect of the invention, a predetermined thickness of the sidewall spacer is set by way of the dopant concentration of the polysilicon layer.

In accordance with a further aspect of the invention, after the patterning the at least one sacrificial layer, an implantation step is carried out in the at least one cutout formed.

In accordance with a further aspect of the invention, after the patterning the at least one sacrificial layer, the sacrificial oxide layer is removed in the at least one cutout formed and, as gate dielectric, preferably an oxide is formed by thermal oxidation.

In accordance with a further aspect of the invention, the sidewall spacer is formed at least in two layers from a sidewall oxide and a sidewall oxide spacer.

In accordance with a further aspect of the invention, the sidewall oxide and the sidewall oxide spacer is produced by application of a sidewall oxide spacer made of CVD oxide before the formation of the gate dielectric, a thermal sidewall oxide simultaneously forming below the CVD oxide during the formation of the gate dielectric.

In accordance with a further aspect of the invention, the gate electrode is formed by metallization which is planarized, preferably by CMP planarization, and preferably comprises TiN and/or W.

In accordance with a further aspect of the invention, the at least one sacrificial layer is removed selectively with respect to the gate electrode and with respect to the underlying gate dielectric, preferably in an anisotropic plasma etching step.

DETAILED DESCRIPTION OF THE INVENTION

Figure 1:
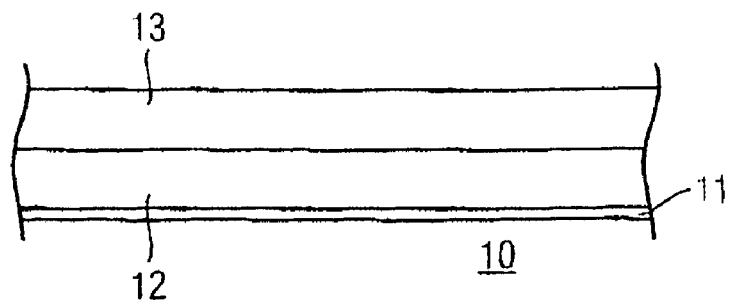
FIGS. 1 to 5 show diagrammatic cross-sectional views of successive intermediate stages in the process for fabricating a semiconductor device for the purpose of elucidating a first embodiment of the present invention.

FIG. 1 illustrates a semiconductor substrate 10, preferably a silicon single crystal on which a sacrificial dielectric 11, preferably an oxide, is applied. A polysilicon 12 is deposited above the sacrificial oxide 11 and a sacrificial nitride layer 13 $Si_3N_4$ is deposited above the polysilicon. This sacrificial layer sequence 11, 12, 13 on the semiconductor substrate 10 is deposited after the removal of any stray oxide (not illustrated).

Figure 2:
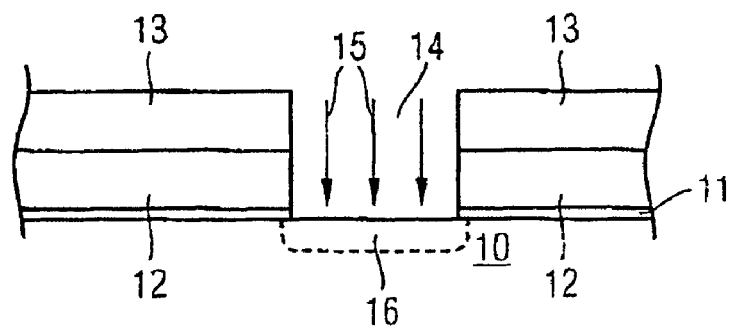

FIG. 2 shows the arrangement in accordance with FIG. 1 after patterning the sacrificial layer sequence 11, 12, 13. In this case, a cutout 14 is provided in the silicon nitride layer 13 and in the polysilicon layer 12 for uncovering the sacrificial oxide layer, for example by an anisotropic plasma etching step. Preferably, a dopant implantation 15 is thereupon effected to provide a predetermined dopant concentration in a predetermined region 16 in the semiconductor substrate 10. This is followed by removing the sacrificial oxide 11 in the region of the cutout 14 (not illustrated).

Figure 3:
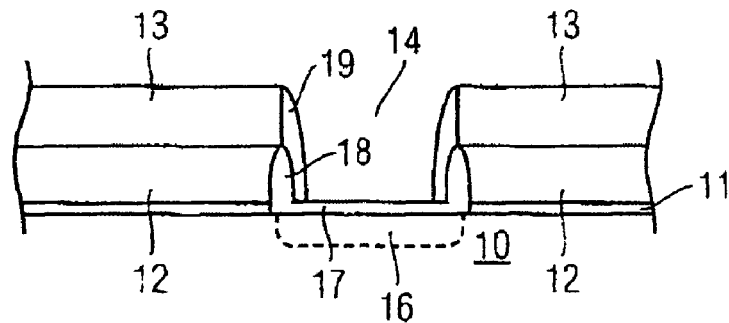

FIG. 3 illustrates the structure in accordance with FIG. 2 after the formation of a gate dielectric 17, preferably an oxide, in the region of the cutout 14 on the doped semiconductor substrate 10, 16. During this preferably thermally stimulated oxidation, the sidewall 18 of the sacrificial polysilicon layer 12 is likewise oxidized. The thickness of the sidewall oxide 18 can be set by doping the sacrificial polysilicon layer 12. In accordance with FIG. 3, a sidewall oxide spacer 19 is provided over the sidewall oxide 18, the spacer extending from the upper edge of the silicon nitride sacrificial layer 13 as far as the gate dielectric 17 and thus completely covering the sidewall oxide 18, which extends from the upper edge of the sacrificial polysilicon layer 12 as far as the gate dielectric 17.

This sidewall oxide spacer 19 is preferably produced before the generation of the gate dielectric 17 in the form of a spacer made of a CVD oxide. As a result of the subsequent gate oxidation for generating the gate dielectric 17, a thermal oxide 18 is additionally produced below the CVD oxide 19 since a CVD oxide 19 restricts the diffusion of oxygen only to a small extent. This oxide 18, for example a thermal oxide or a multilayer made of a thermal oxide and a CVD oxide 18, 19, serves as sidewall oxide 18, 19 after the deposition of the gate dielectric 17.

Figure 4:
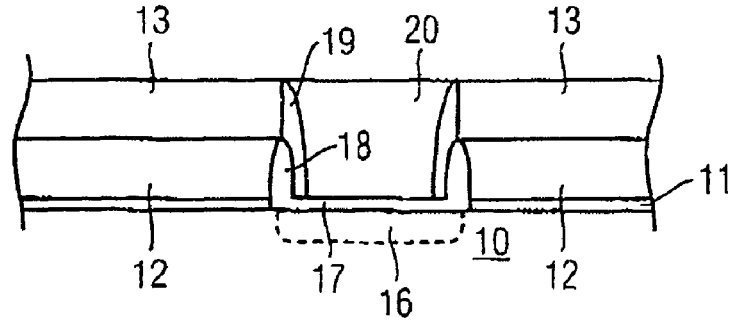

In accordance with FIG. 4, in addition to the structure according to FIG. 3, a gate electrode 20, preferably a metallization, is introduced into the cutout 14 in accordance with FIG. 3. The gate material 20 comprises for example TiN and/or W, it being possible to set the work function for the gate by means of a suitable material mixture, i.e., metal mixture. If necessary, preferably a CMP planarization step is thereupon carried out. The gate electrode 20 introduced after the sidewall spacers 18, 19 is tapered in the direction from the surface of the structure toward the semiconductor substrate 10 on account of the convex form of the sidewall spacers 18, 19.

Figure 5:
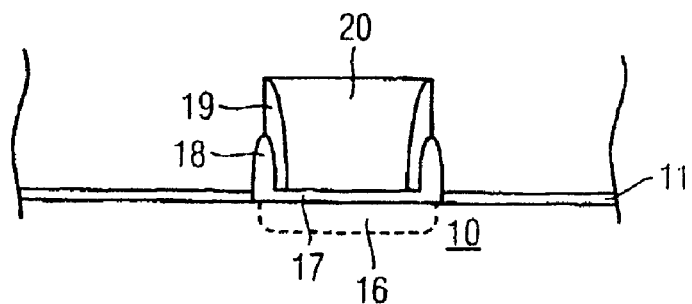

FIG. 5 shows the structure in accordance with FIG. 4 after the removal of the sacrificial silicon nitride layer 13 and the sacrificial polysilicon layer 12. This negative sacrificial gate structure 12, 13 is removed selectively with respect to the gate electrode 20 and with respect to the underlying oxide 17, 11.

Figure 6:
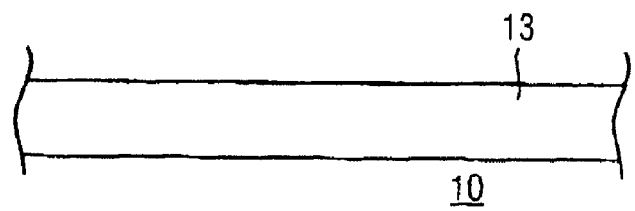
FIGS. 6 to 10 show diagrammatic cross-sectional views of successive intermediate stages in the process for fabricating a semiconductor device for the purpose of elucidating a second embodiment of the present invention.

FIG. 6 illustrates a semiconductor substrate 10, preferably a silicon single crystal, on which a sacrificial layer 13 e.g., a silicon nitride layer $Si_3N_4$, is deposited. This sacrificial layer 13 on the semiconductor substrate 10 is deposited after the removal of a stray oxide (but not illustrated).

Figure 7:
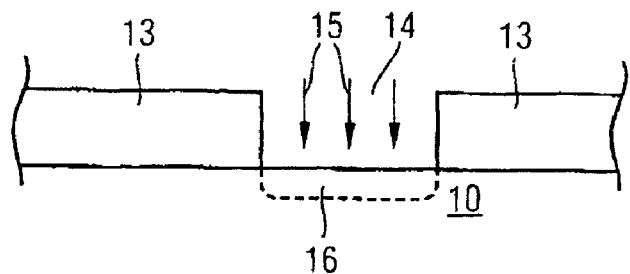

FIG. 7 shows the arrangement in accordance with FIG. 6 after a patterning of the sacrificial layer 13. In this case, a cutout 14 is provided in the sacrificial layer 13, for example by means of an anisotropic plasma etching step, the cutout uncovering the semiconductor substrate 10. Preferably, a dopant implantation 15 is thereupon effected in order to provide a predetermined dopant concentration in a predetermined region 16 in the semiconductor substrate 10.

Figure 8:
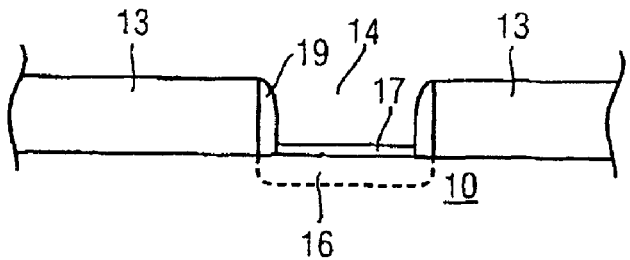

FIG. 8 illustrates the structure in accordance with FIG. 7 after the growth of a gate dielectric 17, preferably an oxide, in the region of the cutout 14 on the doped semiconductor substrate 10, 16. During this preferably thermally stimulated oxidation, the sidewall 19 of the sacrificial polysilicon layer 12 is preferably likewise oxidized. In accordance with FIG. 8, a sidewall oxide spacer 19 is provided, which extends from the upper edge of the sacrificial layer 13 as far as the gate dielectric 17. The sidewall oxide spacer 19 is preferably produced before the generation of the gate dielectric 17 in the form of a spacer made of a CVD oxide (chemical vapor deposition).

Figure 9:
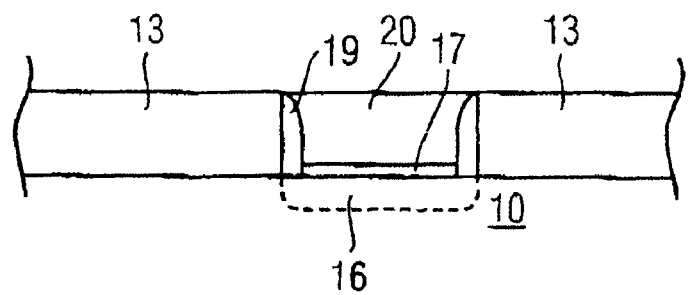

In accordance with FIG. 9, in addition to the structure according to FIG. 8, a gate electrode 20, preferably a metallization, is introduced into the cutout 14 according to FIG. 8. The gate material 20 comprises, for example, TiN and/or W, it being possible to set the work function for the gate by a suitable material mixture, i.e., metal mixture. If necessary, preferably a CMP planarization step is thereupon carried out. The gate electrode 20 introduced after the sidewall spacer 19 is tapered in the direction from the surface of the structure toward the semiconductor substrate 10 on account of the convex form of the sidewall spacer 19, as viewed from the sacrificial layer 13.

Figure 10:
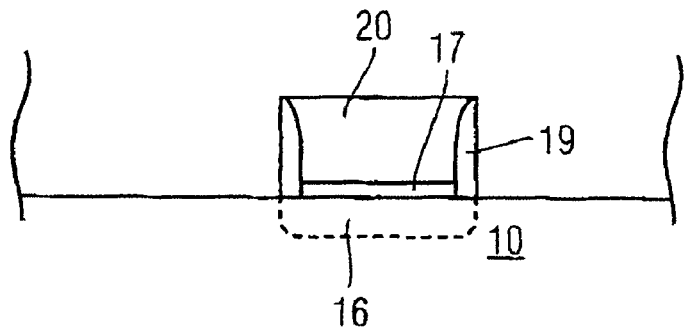

FIG. 10 shows the structure in accordance with FIG. 9 after the removal of the sacrificial layer 13. This negative sacrificial gate structure 13 is removed selectively with respect to the gate electrode 20 and with respect to the underlying dielectric 17.

This is followed in each case by further standard process steps, such as an implantation of S/D extension plus halo, a spacer production, an S/D implant and a wiring of the gate electrode 20 in the fabrication process.

If a metal is used as gate electrode 20, and this is chosen in such a way that it has an optimized work function for an n-channel transistor and a p-channel transistor and a thermostability sufficient for subsequent thermal steps (gate/sidewall oxidation). Moreover, using a metal as gate electrode 20 makes it possible to avoid dopant depletion in the gate (poly depletion). In addition, a low sheet resistance is achieved by using a metal as gate electrode 20.

Although the present invention has been described above on the basis of a preferred exemplary embodiment, it is not restricted thereto, but rather can be modified in diverse ways. Thus, in addition to the production of the gate encapsulation 18, 19 with a thermal oxide before the deposition of the actual gate 20, structures with non-thermally activated dielectric layers such as e.g., $Al_2O_3$ are also conceivable. What is more, the materials specified, for example for the gate electrode, are to be regarded as by way of example.

LIST OF REFERENCE SYMBOLS

10 Semiconductor substrate, preferably Si single crystal
11 Sacrificial oxide
12 Sacrificial polysilicon
13 Sacrificial silicon nitride
14 Cutout
15 Dopant implantation
16 Doped semiconductor substrate
17 Gate dielectric e.g., gate oxide
18 Sidewall oxide
19 Sidewall oxide spacer
20 Gate electrode, preferably metallization

The invention claimed is:

1. A method for fabricating a semiconductor gate structure, comprising:
   depositing a plurality of sacrificial layers on a semiconductor substrate, the plurality at least comprising a sacrificial oxide layer, a doped polysilicon layer and a silicon nitride layer;
   patterning the plurality of sacrificial layers to form at least one cutout in the plurality of sacrificial layers for uncovering the semiconductor substrate;
   forming a sidewall spacer over sidewalls of the plurality of sacrificial layers in the at least one cutout, a predetermined thickness of the sidewall spacer being set by the dopant concentration of the dopes polysilicon layer;
   forming a gate dielectric on the semiconductor substrate in the at least one cutout;
   providing a gate electrode in the at least one cutout in the plurality of sacrificial layers; and
   removing the plurality of sacrificial layers for uncovering the gate electrode surrounded by the sidewall spacer.

2. The method according to claim 1, wherein the plurality of sacrificial layers is formed from a nitride.

3. The method according to one claim 1, wherein, after patterning the plurality of sacrificial layers, implantation is carried out in the at least one cutout.

4. The method according to either of claim 1, wherein, after patterning the plurality of sacrificial layers, the sacrificial oxide layer is removed in the at least one cutout and the gate dielectric is formed by thermal oxidation.

5. The method according to claim 1, wherein the sidewall spacer is formed at least in two layers from a sidewall oxide and a sidewall oxide spacer.

6. The method according to claim 5, wherein the sidewall oxide and the sidewall oxide spacer is produced by applying a sidewall oxide spacer made of CVD oxide before forming the gate dielectric, a thermal sidewall oxide simultaneously forming below the CVD oxide during formation of the gate dielectric.

7. The method according to claim 1, wherein the gate electrode has metallization which is planarized by CMP planarization, and includes at least one of TiN and W.

8. The method according to claim 1, wherein the plurality of sacrificial layers is removed selectively with respect to the gate electrode and with respect to an underlying gate oxide by anisotropic plasma etching.

* * * * *